United States Patent [19]

Maeda et al.

[11] Patent Number: 5,439,990
[45] Date of Patent: Aug. 8, 1995

[54] PHOTOLYTIC POLYMER AND PHOTORESIST COMPOSITION

[75] Inventors: Katsumi Maeda; Kaichiro Nakano; Etsuo Hasegawa, all of Tokyo, Japan

[73] Assignee: NEC Corporation, Tokyo, Japan

[21] Appl. No.: 113,060

[22] Filed: Aug. 30, 1993

[30] Foreign Application Priority Data

Aug. 28, 1992 [JP] Japan .................. 4-229027
Feb. 26, 1993 [JP] Japan .................. 5-037696

[51] Int. Cl.$^6$ .................. C08L 81/04; C08G 75/04
[52] U.S. Cl. .................. 525/535; 430/270
[58] Field of Search .................. 525/535

[56] References Cited

U.S. PATENT DOCUMENTS

| | | | |
|---|---|---|---|
| 2,514,186 | 7/1950 | Albert et al. | 260/446 |
| 3,691,133 | 9/1972 | Sura | 528/90 |
| 4,108,747 | 8/1978 | Crivello et al. | 204/159 |
| 4,173,476 | 11/1979 | Smith et al. | |
| 5,012,001 | 4/1991 | Crivello. | |

OTHER PUBLICATIONS

Crivello et al. J. Org. Chem., 1978, 43(15), 3055.
He et al. J. Org. Chem., 1992, 57, 759.
Crivello et al. J. Polym. Sci., Polym. Chem., 1987 25, 3293.

Primary Examiner—George F. Lesmes
Assistant Examiner—Helen F. Lee
Attorney, Agent, or Firm—Young & Thompson

[57] ABSTRACT

There is provided an highpolymer of the formula:

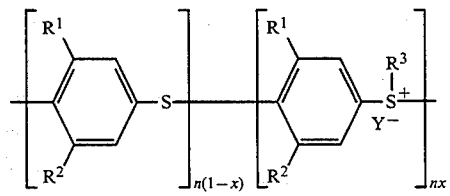

where at least one of $R^1$ and $R^2$ is either an alkyl group having 1 and 3 carbons atoms or an alkoxy group having 1 to 3 carbon atoms and the other is hydrogen, $R^3$ is either a phenyl group or an alkyl group having 1 to 3 carbon atoms, x satisfies the condition that $0 < x \leq 1$, n is a positive integer in the range of from 5 to 700, $Y^-$ is a non-nucleophilic paired ion.

4 Claims, No Drawings

PHOTOLYTIC POLYMER AND PHOTORESIST COMPOSITION

BACKGROUND OF THE INVENTION

The present invention relates to a photolytic polymer and a photoresist composition, and more particularly to a photolytic polymer having a sulfonium salt unit in its main chain.

Recently, studies and developments of chemically amplified resists as high sensitivity of resists have been productive. Such chemically amplified resists show a generation of acid through an exposure from a photo acid generator in the photoresist. Further, the generated acid causes a catalytic reaction. This results in a rapid improvement in a sensitivity of the photoresist. It is thus important to select a suitable photo acid generator for the chemically amplified resist. It is required to produce a photo acid generator having much higher sensitivity. In the past, various types of the photo acid generators have been synthesized. An example of low molecular photo acid generators is a low molecular triphenylsulfonium salt disclosed in Crivello et al., *Journal of the Organic Chemistry*, 1987, Vol. 43, pp. 3055–3058. One example of high molecular photo acid generators is, for example, a high molecular derivative having a sulfonium salt unit in its side chain, which is disclosed in Yamada et al., *Makromolekulare Chemie*, 1972, Vol. 152, 153. Another is a high molecular derivative having a sulfonium salt unit in its main chain, which is disclosed in Crivello et al., *Journal of Polymer Science Polymer Chemistry*, 1987, Vol. 25, p. 3293.

Up-to-date technologies for improvement in high density and high integration of semiconductor devices, however, require compositions having much higher photo-sensitivity. Namely, it has been required to develop a sensitive material which has a high efficiency of the photo-sensitivity and/or an ability to change a solubility of the photoresist much more remarkably. The conventional compositions are too insufficient to respond to the above requirements by the up-to-date technologies. It has been required to develop a much more useful photolytic polymer and photo acid generating polymer.

SUMMARY OF THE INVENTION

Accordingly, it is a primary object of the present invention to provide a novel photolytic polymer.

It is a further object of the present invention to provide a novel photolytic polymer useful as a sensitive material of a photoresist.

It is a still further object of the present invention to provide a novel photolytic polymer which shows a high efficiency of photo-sensitivity with a remarkable variation of its solubility.

It is another object o the present invention to provide a composition for a photoresist which includes a novel photolytic polymer showing a high efficiency of a photo-sensitivity with a remarkable variation of its solubility.

The above and other objects, features and advantages of the present invention will be apparent from the following descriptions.

The present invention provides a novel photolytic polymer of the formula (I):

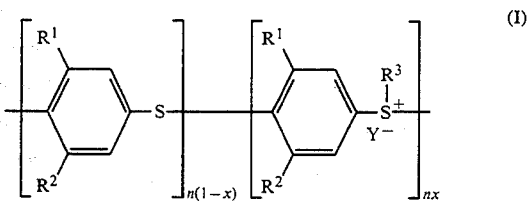

where at least one of $R^1$ and $R^2$ is either an alkyl group having 1 to 3 carbon atoms or an alkoxy group having 1 to 3 carbon atoms and other the is hydrogen, $R^3$ is either a phenyl group or an alkyl group having 1 to 3 carbon atoms, x satisfies the condition that $0 < x \leq 1$, n is a positive integer of from 5 to 700, $Y^-$ is a non-nucleophilic paired ion. For example, as the alkyl group of $R^1$ and $R^2$, methyl group, ethyl group, n-propyl group and isopropyl group and the like are available. As the alkoxy group of $R^1$ and $R^2$, methoxy group, ethoxy group, n-propoxy group, isopropoxy radical and the like are available. As the group of $R^3$, phenyl group, methyl group, ethyl group, n-propyl group and isopropyl group and the like are available.

PREFERRED EMBODIMENTS OF THE INVENTION

The present invention provides a novel photolytic highpolymer of the formula (I):

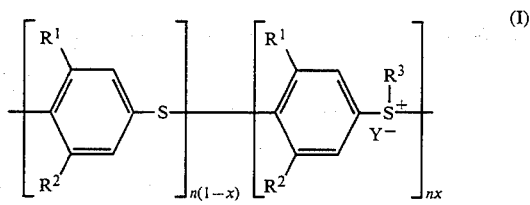

where at least one of $R^1$ and $R^2$ is either an alkyl group having 1 to 3 carbon atoms or an alkoxy group having 1 to 3 carbon atoms and the other is hydrogen, $R^3$ is either a phenyl group or an alkyl group having 1 to 3 carbon atoms, x satisfies the condition that $0 < x \leq 1$, n is a positive integer of from 5 to 700, $Y^-$ is a non-nucleophilic paired ion. For example, as the alkyl group of $R^1$ and $R^2$ methyl group, ethyl group, n-propyl group and isopropyl group and the like are available. As the alkoxy group of $R^1$ and $R^2$, methoxy group, ethoxy group, n-propoxy group, isopropoxy group and the like are available. As the group of $R^3$, phenyl group methyl group ethyl group, n-propyl group and isopropyl group and the like are available.

The novel photolytic polymer may be obtained from the reaction of a soluble polyphenylenesulfide derivative with either a diphenyliodonium salt or an alkyl halide.

For the polymer of the present invention, various properties are important such as solubility, the coefficient of viscosity of the solution, the difference in solubility before and after irradiation with far ultraviolet rays. Further, a reactivity such as photolytic reactivity is also important for the polymer. In view of the above properties of the polymer, it is more preferable that x is in the range of from 0.01 to 0.70 and n is in the range of from 5 to 200.

As the paired ion of $Y^-$, $BF_4^-$, $AsF_6^-$, $SbF_6{}^{2-}$, $PF_6^-$, $CF_3SO_3^-$, $I^-$, $Br^-$, $Cl^-$ and the like are available.

The photolytic polymer having $R^3$ of a phenyl group may be prepared by use of a process disclosed in the abovementioned publications of Crivello et al., which is with respect to low molecular onium salts. Namely, such method utilizes a soluble polyphenylenesulfide derivatives having an average degree of polymerization in the range of from 5 to 700, preferably 5 to 200. Such soluble polyphenylenesulfide derivative may be prepared by a synthesis method as in Tsuchida et al., *Material Forum*, 1990, Vol. 14, pp. 239–242. Namely, the soluble polyphenylenesulfide derivative represented by the following formula (II) is mixed at a desirable molar ratio with a diphenyliodonium salt derivative represented by the following formula (III) to cause a reaction thereof in a nitrogen atmosphere at temperatures 110° C. to 150° C. for 10 minutes to 10 hours.

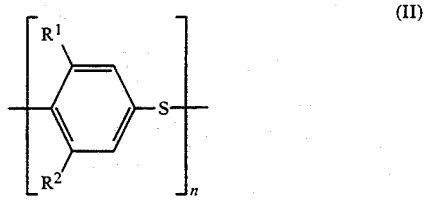
(II)

where at least one of $R^1$ and $R^2$ is either an alkyl group having 1 to 3 carbon atoms or an alkoxy group having 1 to 3 carbon atoms and the other is hydrogen.

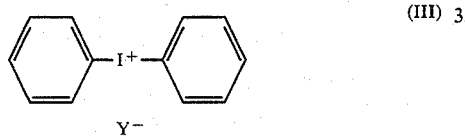
(III)

where $Y^-$ is a non-nucleophilic paired ion.

The reaction may be carried out in solvents such as chlorobenzene and dichlorobenzene, alternatively, no solvent in the presence of catalysts such as copper benzoate (II), copper acetate (II) and copper chloride (I). A product obtained by the reaction is washed with diethyl ether and then dissolved in a solution such as chloroform for subsequent reprecipitation in ether so that the protolytic polymer having $R^3$ of phenyl group is obtained. In view of the solubilities against solvents of the polyphenylenesulfide derivative of the formula (II) and the photolytic highpolymer of the formula (I), it is preferable that at least one of $R^1$ and $R^2$ of the polyphenylenesulfide derivative is an alkyl group or alkoxy group. The polyphenylenesulfide derivative when $R^1$ and $R^2$ are hydrogen is soluble in N-methylpyrrolidone but not soluble in other general solvents such as toluene and methylene chloride.

The photolytic polymer where $R^3$ is an alkyl group according to the present invention may be prepared by utilizing a method relating to low molecular onium salt mentioned in Reisser et al., *Journal of the Organic Chemistry*, 1992, Vol. 57-2, pp. 759–761. Namely, the soluble polyphenylenesulfide derivative of the formula (II) is mixed at a desirable molar ratio with both an alkyl halide represented by the following formula (IV) and an organic acid metal salt represented by the following formula (V) to cause a reaction thereof in methylene chloride at room temperature for 3 to 12 hours.

$$R^3-Z \qquad (IV)$$

where $R^3$ is alkyl group having 1 to 3 carbon atoms and Z is iodine, bromine, chlorine or the like.

$$M^+Y^- \qquad (V)$$

where $Y^-$ is a non-nucleophilic paired ion, $M^+$ is $K^+$, $Na^+$, $Ag^+$ or the like.

After the reaction, insoluble metal salt is isolated by filtration. A filtrate is reprecipitated in ether so that the above photolytic polymer is obtained.

A desirable coefficient "x" of introduction of sulfonium salt unit is freely obtainable by a required variation of the reaction conditions. For example, a ratio of mixture of polyphenylenesulfide derivative (unit mol) to diphenyliodonium salt (mol) is variable within the range of from 1000/1 to 1/1. The reaction temperature is variable within the range of from 110° C. to 150° C. The reaction time is variable within 10 minutes to 10 hours. Alternatively, a ratio of mixture of polyphenylenesulfide derivative (unit mol) to alkyl halide (mol) is variable within the range of from 1000/1 to 1/1. The reaction temperature is variable within the range of from a room temperature to 35° C. The reaction time is variable within 3 to 10 hours.

The photolytic polymer of the formula (I) is normally soluble in various solvents such as acetone, acetonitrile, tetrahydrofuran, N-methylpyrrolidone, benzene and toluene. When the coefficient of introduction of sulfonium salt unit becomes large, the photolytic polymer of the formula (I) becomes insoluble in non-polar solvents such as benzene and toluene. However, when such photolytic polymer is exposed to radiations such as far ultraviolet rays and excimer lasers (KrF and ArF etc.), the photolytic highpolymer shows a remarkable variation of solubility due to either cutting-off of the main chain or a disappearance of an ionic residue so that the photolytic polymer becomes soluble in non-polar solvents such as benzene and toluene. Further, the photolytic polymer shows photolysis whereby acid is generated.

Accordingly, the photolytic highpolymer of the formula (I) is able to serve as photo acid generator, dissolution inhibitor and a sensitive material of photoresist component. The conventional low molecule acid generator typically triphenylsulfonium salt shows almost no ability to form a film thereon and thus is defined the extent of use. In contrast, the high molecular sulfonium salt of the present invention shows a high ability to form a film thereon and thus is useful widely.

EXAMPLE 1

The synthesis of the photolytic polymer where both $R^1$ and $R^2$ are methyl groups and $R^3$ is a phenyl group which is represented by the formula (I) is carried out as follows:

7 g of soluble poly(3,5-dimethyl-1,4-phenylene sulfide) (the polyphenylenesulfide derivative where $R^1$ and $R^2$ are methyl) group hereinafter referred to as PDMPS) having an average molecular weight of 4800 (an average degree of polymerization of 35), 3 g of diphenyliodonium triflate (6.96 mmol) hereinafter referred to as DPIT, and 0.042 g of copper benzoate (0.156 mmol) in a glass flask are subjected to heat and stir treatments in an oil bath of 120° C. to 125° C. for three hours in a nitrogen atmosphere under co-existence of chlorobenzene solvent. After cooling to room temperature, the crystals are washed several times with diethyl ether and then dissolved in chloroform for subsequent reprecipitation thereof in ether. This results in 8 g of the photolytic polymer where a coefficient of introduction of sulfonium salt unit is 12% (x=0.12) according to a calculation based on analyzed values of elements.

The structure of the object and the coefficient of introduction of sulfonium salt were measured by methods such as $^1$H-NMR measurement using AMX-400 NMR, IR measurement using Shimadzu IR-470, elemental analysis (S-analysis: flask burning method and F-analysis:ion selective electrode method). The measurement of molecular weight and detection were carried out by using Shimadzu LC-9A and Shimadzu SPD-6A respectively and further tetrahydrofuran is used as a solvent together with using Showa Denko GPC column (GPC KF-80M).

$^1$H-NMR (acetone-d$_6$, internal standard material:tetramethyl silane):(δ ppm).

2.3 (s, 6H, Methyl)  (IV)

6.7 (s, 1.5H,

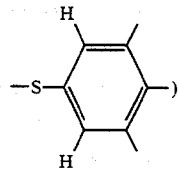

7.1–7.7 (m, 1.1H,

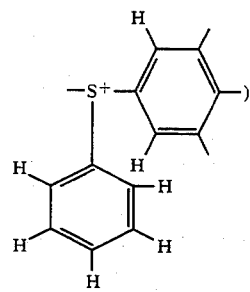

IR (Kbr table): 3040 cm$^{-1}$ (γC—H (CH$_3$)), 1570 cm$^{-1}$ (γ C=C (phenyl)), 875 cm$^{-1}$ (γ C=H (phenyl)). Average molecular weight: 5600 (based upon standard polystyrene)

| elemental analysis | C | H | S | F |
|---|---|---|---|---|
| measured values (% by weight) | 65.11 | 5.40 | 21.86 | 4.25 |
| theoretical values (% by weight) | 65.00 | 5.31 | 21.98 | 4.19 |

EXAMPLE 2

The synthesis of the photolytic polymer where both R$^1$ and R$^2$ are methyl groups and R$^3$ is a phenyl group which is represented by the formula (I) is carried out under the same conditions as EXAMPLE 1 but the ratio of weight of PDMPS/DPIT is different. The result of the elemental analysis and the coefficient of introduction of sulfonium salt (x) are as follows.

| (a ratio of weight of PDMPS/DPIT is 90/10) (calculated value from elemental analysis x is 0.02) | | | | |
|---|---|---|---|---|
| elemental analysis | C | H | S | F |
| measured values (% by weight) | 69.80 | 5.68 | 23.40 | 1.01 |
| theoretical values (% by weight) | 69.47 | 5.80 | 23.24 | 0.81 |

EXAMPLE 3

The synthesis of the photolytic polymer where both R$^1$ and R$^2$ are methyl groups and R$^3$ is a phenyl group which is represented by the formula (I) is carried out under the same conditions as that of EXAMPLE 1 but for a ratio of weight of PDMPS/DPIT. The result of the elemental analysis and the coefficient of introduction of sulfonium salt (x) are as follows.

| (a ratio of weight of PDMPS/DPIT is 40/60) (calculated value from elemental analysis x is 0.32) | | | | |
|---|---|---|---|---|
| elemental analysis | C | H | S | F |
| measured values (% by weight) | 58.83 | 4.72 | 20.14 | 8.79 |
| theoretical values (% by weight) | 58.97 | 4.64 | 20.29 | 8.74 |

EXAMPLE 4

The synthesis of the photolytic polymer where both R$^1$ and R$^2$ are methyl groups and R$^3$ is a phenyl group which is represented by the formula (I) is carried out under the same conditions as EXAMPLE 1 but the ratio of weight of PDMPS/DPIT is different. The result of the elemental analysis and the coefficient of introduction of sulfonium salt (x) are as follows.

| (a ratio of weight of PDMPS/DPIT is 20/80) (calculated value from elemental analysis x is 0.56) | | | | |
|---|---|---|---|---|
| elemental analysis | C | H | S | F |
| measured values (% by weight) | 54.55 | 4.30 | 19.14 | 12.21 |
| theoretical values (% by weight) | 54.47 | 4.14 | 19.03 | 12.14 |

EXAMPLE 5

The synthesis of the photolytic polymer where both R$^1$ and R$^2$ are methyl groups and R$^3$ is a phenyl group which is represented by the formula (I) is carried out under the same conditions as EXAMPLE 1 but the ratio of weight of PDMPS/DPIT is different. The result of the elemental analysis and the coefficient of introduction of sulfonium salt (x) are as follows.

| (a ratio of weight of PDMPS/DPIT is 10/90) (calculated value from elemental analysis x is 0.74) | | | | |
|---|---|---|---|---|
| elemental analysis | C | H | S | F |
| measured values (% by weight) | 52.23 | 3.77 | 18.34 | 13.90 |
| theoretical values (% by weight) | 52.15 | 3.88 | 18.38 | 13.89 |

EXAMPLE 6

The synthesis of the photolytic polymer where both $R^1$ and $R^2$ are methyl groups and $R^3$ is a phenyl group which is represented by the formula (I) is carried out under the same conditions as EXAMPLE 1 but the ratio of weight of PDMPS/DPIT is different. The result of the elemental analysis and the coefficient of introduction of sulfonium salt (x) are as follows.

| (a ratio of weight of PDMPS/DPIT is 5/95) (calculated value from elemental analysis x is 1.00) | | | | |
|---|---|---|---|---|
| elemental analysis | C | H | S | F |
| measured values (% by weight) | 50.13 | 3.77 | 17.34 | 15.90 |
| theoretical values (% by weight) | 49.72 | 3.62 | 17.69 | 15.79 |

EXAMPLE 7

The synthesis of the photolytic polymer where both $R^1$ and $R^2$ are methyl groups and $R^3$ is a phenyl group which is represented by the formula (I) is carried out under the same conditions as EXAMPLE 1 except that 3.3 g of diphenyliodonium $AsF_6^-$ is used in place of 3.0 g of diphenyliodonium triflate. The result of the elemental analysis and the coefficient of introduction of sulfonium salt (x) are as follows.

| (yield: 8.1 gr.) (calculated value from elemental analysis x is 0.18) | | | | |
|---|---|---|---|---|
| elemental analysis | C | H | S | F |
| measured values (% by weight) | 59.35 | 4.98 | 17.61 | 11.06 |
| theoretical values (% by weight) | 59.24 | 4.87 | 17.41 | 11.15 |

EXAMPLE 8

The synthesis of the photolytic polymer where both $R^1$ and $R^2$ are methyl groups and $R^3$ is a phenyl group which is represented by the formula (I) is carried out the same conditions as that of EXAMPLE 1 except that 3.6 g of diphenyliodonium $SbF_6^-$ is used in place of 3.0 g of diphenyliodonium triflate. The result of the elemental analysis and the coefficient of introduction sulfonium salt (x) are as follows.

| (yield: 8.0 gr.) (calculated value from elemental analysis x is 0.17) | | | | |
|---|---|---|---|---|
| elemental analysis | C | H | S | F |
| measured values (% by weight) | 57.54 | 4.87 | 17.11 | 10.35 |
| theoretical values (% by weight) | 57.20 | 4.71 | 16.93 | 10.23 |

EXAMPLE 9

The synthesis of the photolytic polymer where both $R^1$ and $R^2$ are methyl groups and $R^3$ is a phenyl group which is represented by the formula (I) is carried out under the same conditions as EXAMPLE 1 except that 2.6 g of diphenyliodonium $BF_4^-$ is used in place of 3.0 g of diphenyliodonium triflate. The result of the elemental analysis and the coefficient of introduction of sulfonium salt (x) are as follows.

| (yield: 7.5 gr.) (calculated value from elemental analysis x is 0.17) | | | | |
|---|---|---|---|---|
| elemental analysis | C | H | S | F |
| measured values (% by weight) | 66.14 | 5.57 | 19.61 | 7.95 |
| theoretical values (% by weight) | 66.03 | 5.44 | 19.54 | 7.87 |

EXAMPLE 10

The synthesis of the photolytic polymer where both $R^1$ and $R^2$ are methyl groups and $R^3$ is a phenyl group which is represented by the formula (I) is carried out under the same conditions as EXAMPLE 1 except that 3.0 g of diphenyliodonium $PF_6^-$ is sued in place of 3.0 g of diphenyliodonium triflate. The result of the elemental analysis and the coefficient of introduction sulfonium salt (x) are as follows.

| (yield: 7.9 gr.) (calculated value from elemental analysis x is 0.16) | | | | |
|---|---|---|---|---|
| elemental analysis | C | H | S | F |
| measured values (% by weight) | 62.54 | 5.27 | 18.71 | 10.55 |
| theoretical values (% by weight) | 62.66 | 5.16 | 18.67 | 10.62 |

EXAMPLE 11

The synthesis of the photolytic polymer of the formula (I) where all of $R^1$, $R^2$ and $R^3$ are methyl groups is carried out as follows.

1 g of soluble poly(3,5-dimethyl-1,4-phenylene sulfido) (the polyphenylenesulfide derivative where $R^1$ and $R^2$ in the formula (II) are methyl groups having an average molecular weight of 4800 (an average degree of polymerization of 35), 0.52 g of methyl iodide, and 0.94 g of silver trifluorometasulfonic acid (in a glass flask) are subjected to a stir treatment for twelve hours at room temperature in 12 ml of methylene chloride to cause a reaction thereof. After the reaction, insoluble metal salt is isolated through filtration and the filtrate is added with ether to deposit a white polymer. The polymer is dissolved in acetone for subsequent reprecipitation thereof in ether so that 0.87 g of the polymer is obtained where a coefficient of introduction of sulfonium slat unit is 21% (x=0.21) according to a calculation based on analyzed values of elements.

The structure of the object and the coefficient of introduction of sulfonium salt were measured by methods such as $^1$H-NMR measurement using AMX-400 NMR, IR measurement using Shimadzu IR-470 and elemental analysis. The measurement of molecular weight and detection were carried out by using THF as a solvent together with using Showa Denko GPC column (GPC KF-80M).

$^1$H-NMR (acetone-$d_6$, internal standard material: tetramethyl silane): δ (ppm). 2.3 ( s, 6H, methyl), 3.9 (s, 0.6H, S+-Me), 6.5-7.7 (m, 2H, aromatic). IR (KBr tablet): 3030 cm$^{-1}$ ($\gamma_{C-H}$ ($CH_3$)), 1568 cm$^{-1}$ ($\gamma_{C=C}$ (phenyl)), 872 cm$^{-1}$ ($\gamma_{C-H}$(phenyl)). Average molecular weight: 4900 (polystyrene conversion)

| elemental analysis | C | H | S | F |
|---|---|---|---|---|
| measured values | 59.61 | 5.20 | 22.46 | 7.15 |

| elemental analysis | C | H | S | F |
|---|---|---|---|---|
| (% by weight) | | | | |
| theoretical values (% by weight) | 59.26 | 5.10 | 22.73 | 7.01 |

EXAMPLE 12

A cyclohexanone solution (8% by weight) of the polymer synthesized by the method of EXAMPLE 1 is subjected to a spin coating treatment at a 750 rpm rotating speed for 20 seconds and a subsequent spin coating treatment at a 3000 rpm rotating speed for 40 seconds to form a spin coating film on a $SiO_2$ substrate. The spin coating film is then subjected to a dry treatment at a temperature of 100° C. for 90 seconds whereby a thin film having a thickness of 1.0 micrometers is obtained. The thin film is then exposed to a KrF excimer laser (MEX excimer layer, NEC Corporation). An exposed region of the thin film is dissolved in 2 ml of an acetonitrile solution having a concentration 32 micromol/l including a sodium salt of tetrabromo phenol blue as an indicator. The whole of the same is further diluted to 20 ml with acetonitrile for a measurement of the visible absorption spectrum thereof. A determination of generated acid is found by a variation of a degree of absorption of 619 nanometers wavelength according to a method mentioned in 1976 Analytical Chemistry vol. 48-2 pp. 450–451. In this method, previous to the determination of the generated acid, a working curve which indicates a relation of the number of moles of the acid and the degree of light absorption at 619 nanometers has been prepared from degrees of light absorptions of a predetermined amount of p-toluene sulfonic acid dissolved in acetonitrile having an indicator.

From the above measurement, it was confirmed that an application of radiation of 100 $mJ/cm^2$ to the polymer of EXAMPLE 1 makes 30 nanomol of acid generated.

EXAMPLE 13

An amount of 18 g of poly(p-hydroxystyrene) (average molecular weight 30000) is prepared where 30% of the hydroxy group is modified with a tert-butoxycarbonyl group. An amount of 2 g of the polymer obtained through EXAMPLE 1 and 18 g of the poly(p-hydroxystyrene) are dissolved in 80 g of cyclohexanone and then subjected to a filtration by a membrane filter (pare size: 0.2 μm) for adjustment to a resist solution.

The prepared resist solution is subjected to a spin coating on a silicon substrate and the thin film is then baked on a hot plate at a temperature of 120° C. for one minute to form a resist layer having a thickness of 1.0 micrometer. The resist layer is exposed to a KrF excimer laser (MEX excimer laser NEC Corporation) as an exposure source by using a KrF excimer layer stepper (the numerical aperture of 0.42).

The wafer is immersed in tetramethyl ammonium hydroxide solution (0.14 mol/l) for 60 seconds for its development and then immersed in isopropylalcohol for 30 seconds for its rinse. In the above case, the amount of exposure is 50 $mJ/cm^2$ and the minimum resolution size is 0.75 micrometerL/S.

EXAMPLE 14

An amount of 2 g of the polymer obtained through EXAMPLE 1 and 18 g of the poly(p-hydroxystyrene) having an average molecular weight of 20000 are dissolved in 80 g of cyclohexanone and then subjected to a filtration by membrane filter having 0.2 micrometer openings for adjustment of a resist solution.

The prepared resist solution is subjected to a spin coating to form a thin film having a thickness of 1.0 micrometer on a silicon substrate. The thin film is baked on a hot plate at a temperature of 120° C. for one minute to form a resist layer. The resist layer is then immersed into tetramethyl ammonium hydroxide solution (0.14 mol/l) for a measurement of dissolution velocity of the film. The film is exposed to a KrF excimer laser of an amount of exposure of 100 $mJ/cm^2$ for a subsequent measurement of dissolution velocity of the film. The solution velocity of the film exposed to the excimer laser is about a hundred times as compared to the dissolution velocity of the unexposed film.

EXAMPLE 15

The synthesis of the photolytic polymer is carried out under similar conditions as EXAMPLE 1 but using a PDMPS of an average molecular weight 18000 (an average degree of polymerization of 132). The result of the elemental analysis and the coefficient of introduction of sulfonium salt (x) are as follows.

| (a ratio of weight of PDMPS/DPIT is 70/30) (calculated value from elemental analysis x is 0.10) | | | | |
|---|---|---|---|---|
| elemental analysis | C | H | S | F |
| measured values (% by weight) | 65.90 | 5.68 | 22.40 | 3.41 |
| theoretical values (% by weight) | 65.79 | 5.39 | 22.20 | 3.59 |

EXAMPLE 16

The synthesis of the photolytic polymer is carried out under similar conditions as EXAMPLE 1 but using a PDMPS of an average molecular weight 18000 (an average degree of polymerization of 132). The result of the elemental analysis and the coefficient of introduction of sulfonium salt (x) are as follows.

| (a ratio of weight of PDMPS/DPIT is 45/55) (calculated value from elemental analysis x is 0.29) | | | | |
|---|---|---|---|---|
| elemental analysis | C | H | S | F |
| measured values (% by weight) | 59.90 | 4.68 | 20.30 | 8.31 |
| theoretical values (% by weight) | 59.70 | 4.72 | 20.49 | 8.19 |

EXAMPLE 17

The synthesis of the photolytic polymer is carried out under similar conditions as EXAMPLE 1 but using a PDMPS of an average molecular weight 18000 (an average degree of polymerization of 132). The result of the elemental analysis and the coefficient of introduction of sulfonium salt (x) are as follows.

| (a ratio of weight of PDMPS/DPIT is 37/63) (calculated value from elemental analysis x is 0.50) | | | | |
|---|---|---|---|---|
| elemental analysis | C | H | S | F |
| measured values (% by weight) | 55.60 | 4.38 | 19.40 | 11.31 |
| theoretical values | 55.41 | 4.25 | 19.29 | 11.43 |

-continued

| (a ratio of weight of PDMPS/DPIT is 37/63) | | | | |
|---|---|---|---|---|
| (calculated value from elemental analysis x is 0.50) | | | | |
| elemental analysis- | C | H | S | F |
| (% by weight) | | | | |

EXAMPLE 18

The synthesis of the photolytic polymer is carried out under similar conditions as EXAMPLE 1 but using a PDMPS of an average molecular weight 18000 (an average degree of polymerization of 132). The result of the elemental analysis and the coefficient of introduction of sulfonium salt (x) are as follows.

| (a ratio of weight of PDMPS/DPIT is 35/75) | | | | |
|---|---|---|---|---|
| (calculated value from elemental analysis x is 0.64) | | | | |
| elemental analysis | C | H | S | F |
| measured values (% by weight) | 53.50 | 4.18 | 18.60 | 12.81 |
| theoretical values (% by weight) | 53.35 | 4.02 | 18.71 | 12.98 |

EXAMPLE 19

The method is the same as that of EXAMPLE 12 except that the thin film is exposed to a ArF excimer laser (Lumonics HE-460-SM-A) in which an amount of exposure is 100 mJ/cm$^2$. This results in that 80 nanomol of acid is obtained.

EXAMPLE 20

The synthesis of the photolytic polymer is carried out under similar conditions as EXAMPLE 1 but using a PDMPS of an average molecular weight 1100 (an average degree of polymerization of 8). The result of the elemental analysis and the coefficient of introduction of sulfonium salt (x) are as follows.

| (a ratio of weight of PDMPS/DPIT is 70/30) | | | | |
|---|---|---|---|---|
| (calculated value from elemental analysis x is 0.12) | | | | |
| elemental analysis | C | H | S | F |
| measured values (% by weight) | 65.19 | 5.39 | 22.10 | 4.35 |
| theoretical values (% by weight) | 65.00 | 5.31 | 21.98 | 4.19 |

EXAMPLE 21

The synthesis of the photolytic polymer is carried out under similar conditions as EXAMPLE 1 but using a PDMPS of an average molecular weight 1100 (an average degree of polymerization of 8). The result of the elemental analysis and the coefficient of introduction of sulfonium salt (x) are as follows.

| (a ratio of weight of PDMPS/DPIT is 45/55) | | | | |
|---|---|---|---|---|
| (calculated value from elemental analysis x is 0.36) | | | | |
| elemental analysis | C | H | S | F |
| measured values (% by weight) | 58.24 | 4.42 | 20.21 | 9.54 |
| theoretical values (% by weight) | 58.06 | 4.54 | 20.03 | 9.43 |

EXAMPLE 22

The synthesis of the photolytic polymer is carried out under similar conditions as EXAMPLE 1 but using a PDMPS of an average molecular weight 1100 (an average degree of polymerization of 8). The result of the elemental analysis and the coefficient of introduction of sulfonium salt (x) are as follows.

| (a ratio of weight of PDMPS/DPIT is 37/63) | | | | |
|---|---|---|---|---|
| (calculated value from elemental analysis x is 0.52) | | | | |
| elemental analysis | C | H | S | F |
| measured values (% by weight) | 55.32 | 4.40 | 19.46 | 11.51 |
| theoretical values (% by weight) | 55.08 | 4.21 | 19.20 | 11.68 |

EXAMPLE 23

The synthesis of the photolytic polymer is carried out under similar conditions as EXAMPLE 1 but using a PDMPS of an average molecular weight 1100 (an average degree of polymerization of 8). The result of the elemental analysis and the coefficient of introduction of sulfonium salt (x) are as follows.

| (a ratio of weight of PDMPS/DPIT is 30/70) | | | | |
|---|---|---|---|---|
| (calculated value from elemental analysis x is 0.67) | | | | |
| elemental analysis | C | H | S | F |
| measured values (% by weight) | 52.80 | 3.78 | 18.40 | 13.41 |
| theoretical values (% by weight) | 52.97 | 3.98 | 18.61 | 13.27 |

EXAMPLE 24

An amount of 0.05 g of the polymer obtained through EXAMPLEs 4, 17 and 22 and 1 g of the poly(methylmethacrylate) having an average molecular weight of 120000 (Aldrich Chemical Company, Inc. (U.S.A.)) are dissolved in 5 ml of methylisobutylketone and then subjected to a filtration by membrane filter having 0.2 micrometer pore size.

The resultant solution is subjected to a spin coating to form a thin film having a thickness of 1.0 micrometer on a silicon substrate. The thin film is baked on a hot plate at a temperature of 120° C. for one minute to form a resist layer. The resist layer is then exposed to ArF excimer laser (Lumonics HE-460-SM-A) at an exposure area of 3 cm$^2$ to generate acid. The amount of the generated acid is measured by the method mentioned in EXAMPLE 12. The result is as follows as compared with the well known triphenylsulfonium triflate.

| Polymer | average degree of polymerization (n) | coefficient of introduction (x) | amount of generated acid (n mol) |
|---|---|---|---|
| EXAMPLE 4 | 35 | 0.56 | 7.0 |
| EXAMPLE 17 | 132 | 0.50 | 6.7 |
| EXAMPLE 22 | 8 | 0.52 | 6.8 |
| COMPARISON | — | — | 3.5 |

1) Amount of exposure: 40 mJ/cm$^2$

From the above results, it was confirmed that the photolytic polymer of the present invention shows a high efficiency of acid generation even when polymers have low average degrees of polymerization.

EXAMPLE 25

The synthesis of the photolytic polymer of the formula (I) where all of $R^1$ is methyl group, $R^2$ is hydrogen and $R^3$ is phenyl group is carried out as follows.

An amount of 4g of soluble poly(3-methyl-1,4-phenylenesulfide) (a polyphenylenesulfide derivative where $R^1$ and $R^2$ in the formula (II) are methyl group and hydrogen respectively) is prepared having an average molecular weight of 3600 (an average degree of polymerization of 26). 4 g soluble poly(3-methyl-1,4-phenylenesulfide), 7 g of DPIT (16.27 mmol) and 0.098 g of copper benzoate (0.364 mmol) in a glass flask are subjected to a stir heat treatment in 12 ml of chlorobenzene under a nitrogen atmosphere for three hours at a temperature in the range of from 120° C. to 125° C. in a nitrogen atmosphere. After that, the crystals are washed several times with diethyl ether and then dissolved in acetone for a subsequent reprecipitation in ether so that 6.0 g of the polymer is obtained where the coefficient of introduction of sulfonium salt unit is 40% (x=0.40) according to a calculation based on analyzed values of elements.

| elemental analysis | C | H | S | F |
| --- | --- | --- | --- | --- |
| measured values (% by weight) | 55.54 | 3.91 | 21.32 | 10.72 |
| theoretical values (% by weight) | 55.35 | 3.79 | 21.11 | 10.72 |

EXAMPLE 26

The method is the same as that of EXAMPLE 12 except that the polymer of EXAMPLE 25 and the ArF excimer laser (Lumonics HE-460-SM-A) are used and the amount of exposure is 100 mJ/cm$^2$. This results in that 95 nanomol of acid is obtained.

The photolytic polymer of the present invention is obtainable from the reaction of soluble polyphenylenesulfide with either diphenyliodonium salt or alkyl halide. The variation of the ratio of the mixture is able to control the coefficient of introduction of the sulfonium salt unit.

The photolytic polymer of the present invention shows acid generation by the exposure of the radiation whereby the solubility is changed. The polymer is usable as photo acid generator and as dissolution inhibitor and thus applicable to sensitive material of the photoresist.

What is claimed is:

1. A polymer of the formula:

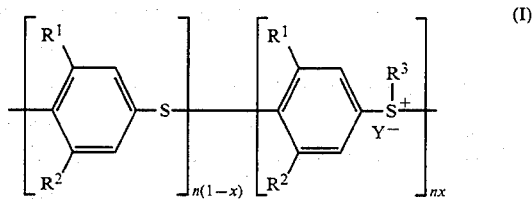

where at least one of $R^1$ and $R^2$ is either an alkyl group having 1 to 3 carbon atoms or an alkoxy group having 1 to 3 carbon atoms and the other is hydrogen, $R^3$ is either a phenyl group or an alkyl group having 1 to 3 carbon atoms, x is 0.1 to 0.7, n is a positive integer in the range of from 10 to 700, $Y^-$ is a non-nucleophilic paired ion.

2. The polymer as claimed in claim 1, wherein said non-nucleophilic paired ion is selected from $BF_4^-$, $ASF_6^-$, $SbF_6^-$, $PF_6^-$ or $CF_3SO_3^-$.

3. A photoresist composition including a polymer of the formula:

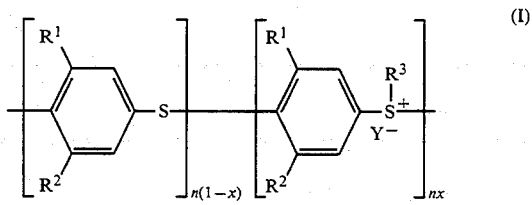

where at least one of $R^1$ and $R^2$ is either an alkyl group having 1 to 3 carbon atoms or an alkoxy group having 1 to 3 carbon atoms and the other is hydrogen, $R^3$ is either a phenyl group or an alkyl group having 1 to 3 carbon atoms, x is 0.1 to 0.7, n is a positive integer in the range of from 10 to 700, $Y^-$ is a non-nucleophilic paired ion.

4. The composition as claimed in claim 3, wherein said non-nucleophilic paired ion is selected from $BF_4^-$, $ASF_6^-$, $SbF_6^-$, $PF_6^-$ or $CF_3SO_3^-$.

* * * * *